US006563760B2

(12) United States Patent
Song (10) Patent No.: US 6,563,760 B2
(45) Date of Patent: May 13, 2003

(54) CIRCUIT AND METHOD FOR GENERATING INTERNAL COMMAND SIGNALS IN A SEMICONDUCTOR MEMORY DEVICE

(75) Inventor: Dae Sik Song, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/029,992

(22) Filed: Dec. 31, 2001

(65) Prior Publication Data

US 2002/0163850 A1 Nov. 7, 2002

(30) Foreign Application Priority Data

May 4, 2001 (KR) .......................................... 2001-24262

(51) Int. Cl.[7] .............................................. G11C 8/00
(52) U.S. Cl. .................................. 365/233; 365/230.08
(58) Field of Search .............................. 365/233, 230.08

(56) References Cited

U.S. PATENT DOCUMENTS

| 5,255,229 A | 10/1993 | Tanaka et al. ............... 365/201 |
| 5,305,261 A | 4/1994 | Furutani et al. ......... 365/189.01 |
| 5,469,393 A | 11/1995 | Thomann ..................... 365/201 |
| 5,511,029 A | 4/1996 | Sawada et al. .............. 365/201 |
| 5,544,108 A | 8/1996 | Thomann ..................... 365/201 |
| 5,548,596 A | 8/1996 | Tobita ........................ 371/21.2 |
| 5,684,748 A | 11/1997 | Jang ............................ 365/201 |
| 5,910,923 A | 6/1999 | Brown et al. ................ 365/201 |
| 6,069,829 A | 5/2000 | Komai et al. ................ 365/201 |
| 6,084,809 A | 7/2000 | Wada .......................... 365/203 |
| 6,111,807 A | 8/2000 | Ooishi ..................... 365/230.01 |
| 6,337,814 B1 * | 6/2002 | Tanida et al. ........... 365/189.09 |

FOREIGN PATENT DOCUMENTS

| EP | 0 953 987 A2 | 11/1999 |
| GB | 2 345 565 A | 7/2000 |
| JP | 59-198594 | 11/1984 |
| JP | 10-21150 | 1/1989 |
| JP | 63-108589 | 1/1990 |
| JP | 3-137889 | 6/1991 |
| JP | 5-101699 | 4/1993 |
| JP | 5-159600 | 6/1993 |
| JP | 7-296598 | 11/1995 |
| JP | 9-288898 | 11/1997 |
| JP | 10-208497 | 8/1998 |
| JP | 11-329000 | 11/1999 |

* cited by examiner

Primary Examiner—M. Tran
(74) Attorney, Agent, or Firm—Pillsbury Winthrop LLP (57) ABSTRACT

Described inventions include circuits and methods for generating internal command signals in a semiconductor memory device. A testing time can be remarkably reduced by setting an internal clock signal having a predetermined cycle time shorter than that of an external clock signal of a test equipment, and generating internal command signals of the semiconductor memory device which synchronously respond to the internal clock signal. A command signal decoder composes the plurality of internal control signals. It then generates a test mode enable signal and a reversed test mode enable signal in response to a flag signal of internal address signals for precharging all the banks, and composes the reversed test mode enable signal and the plurality of internal control signals and then generates the internal command signals of the semiconductor memory device. An internal clock generating unit generates a first and second internal clock signals when the test mode enable signal is enabled, and composes the test mode enable signal and one of the internal command signals of the semiconductor memory device and then generates a plurality of internal command control signals which synchronously respond to the first and second internal clock signals.

20 Claims, 9 Drawing Sheets

CIRCUIT AND METHOD FOR GENERATING INTERNAL COMMAND SIGNALS IN A SEMICONDUCTOR MEMORY DEVICE

RELATED APPLICATIONS

This application relies for priority upon Korean Patent Application No. 2001-24262, filed on May 4, 2001, the contents of which are herein incorporated by reference in their entirety.

BACKGROUND

1. Field of the Invention

The present invention generally relates to the generation of internal command signals in a semiconductor memory device, and more specifically to the generation of internal command signals synchronized to an internal clock signal having a predetermined cycle time shorter than a cycle time of an external clock signal, such as from a test equipment.

2. General Background and Related Art

Many tests have been carried out on mass-produced synchronous dynamic random access memory (DRAM). When simultaneously testing many DRAM chips installed in a test equipment, an operation cycle time of a clock should be established that is much longer than a clock cycle of a normal operation in the synchronous DRAM in order to accomplish a regular transmission of signals between the test equipment and the DRAMs, because there is a large load capacitance at output terminals of the test equipment due to the testing of many DRAM chips.

A conventional internal command signal generating circuit in the semiconductor memory device is explained hereinafter.

Figure 1:
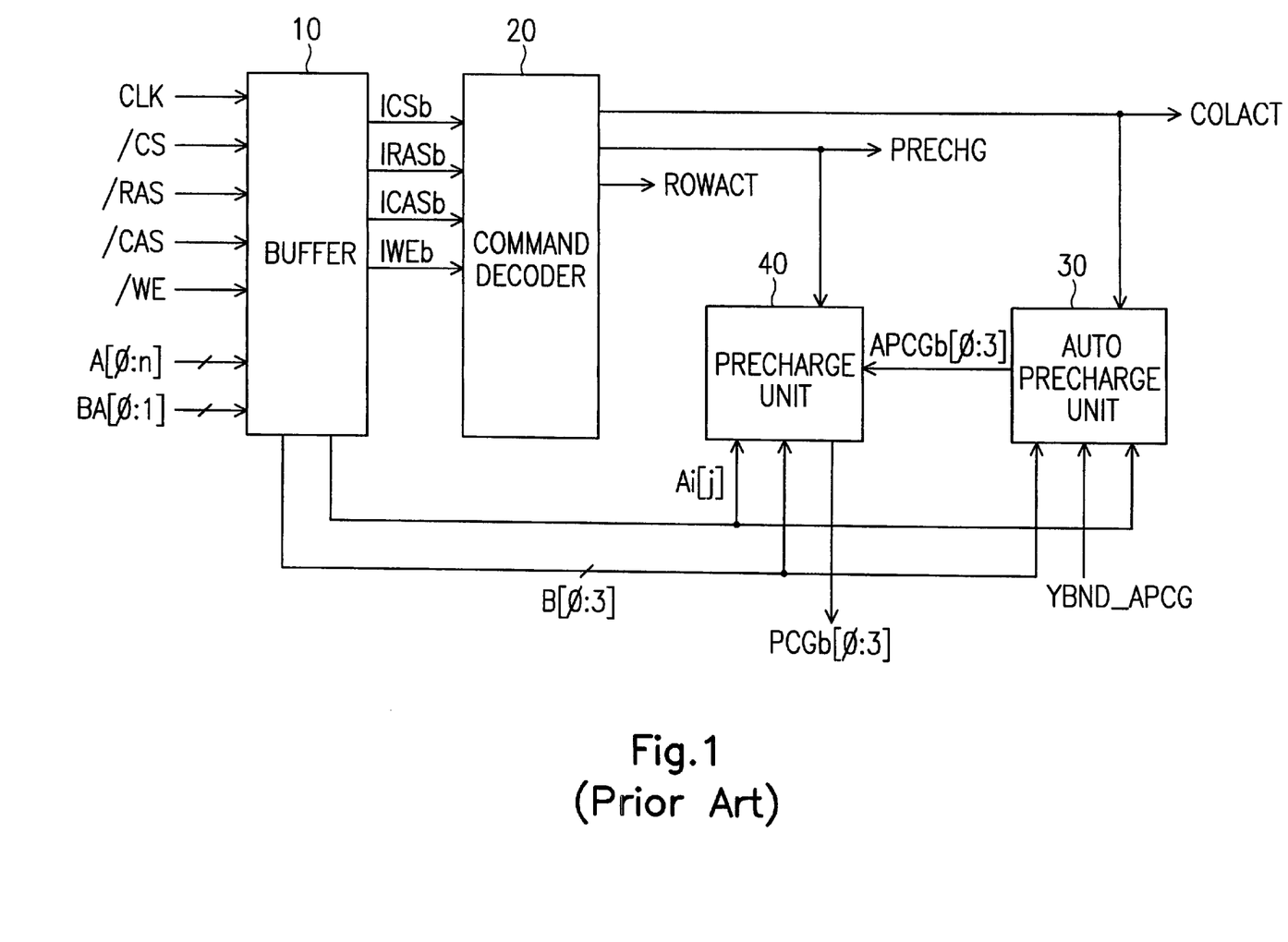
FIG. 1 is a block diagram of a known arrangement showing an internal command signal generating circuit of the semiconductor memory device.

FIG. 1 is a circuit diagram of a known arrangement for generating internal command signals in a semiconductor memory device. The conventional internal command signal generating circuit includes a buffer 10, a command signal decoder 20, an auto precharge unit 30, and a precharge unit 40. The buffer 10 generates internal control signals ICSb, IRASb, ICASb, and IWEb, internal address signal Ai[j], and buffered bank address signals B[0:3] in response to external clock signal CLK of the test equipment, external control signals /CS, /RAS, /CAS, and /WE, address signals A[0:n] of the DRAM, and bank address signals BA[0:1]. The command signal decoder 20 generates column active command signal COLACT, row active command signal ROWACT, and precharge command signal PRECHG in response to the internal control signals ICSb, IRASb, ICASb, and IWEb. The auto precharge unit 30 generates auto precharge signals APCGb[0:3] in response to the column active command signal COLACT, one of the internal address signals Ai[j], the buffered bank address signals B[0:3], and auto precharge control signal YBND__APCG for controlling an operation of the auto precharge, after a burst operation of read or write for one memory bank region is completed. The precharge unit 40 generates bank precharge signals PCGb[0:3] in response to the precharge command signal PRECHG, one of the internal address signals Ai[j], the buffered bank address signals B[0:3], and the auto precharge signals APCGb[0:3].

In the conventional internal command signal generator having the aforementioned structure, it is required that the cycle time of the external clock signal of the test equipment be much longer than the clock cycle time for normal operation of the synchronous DRAM, in case of simultaneously performing a test procedure for many chips of DRAMs installed in the test equipment. In this manner, the regular transmission with signals can be achieved. Briefly, because of setting the clock cycle time as described above, the testing time is consequently increased.

SUMMARY

At least some of the inventions claimed herein provide circuits and methods for setting an internal clock signal to have a predetermined cycle time shorter than that of external clock signal of a test equipment, and generating internal command signals synchronized with the internal clock signal, thereby reduce a testing time that would otherwise be required.

According to an aspect of the present invention, there is provided an internal command signal generating circuit in a semiconductor memory device. The circuit includes a buffer for generating a plurality of internal control signals, a plurality of internal address signals, and a plurality of buffered bank address signals in response to external clock signal of a test equipment, a plurality of external control signals, a plurality of address signals, and a plurality of bank address signals. A command signal decoder composes the plurality of internal control signals and generates a test mode enable signal and a reversed test mode enable signal in response to a flag signal of the plurality of internal address signals for precharging all the bank, and composing the reversed test mode enable signal and the plurality of internal control signals and generating internal command signals of the semiconductor memory device. An auto precharge unit generates a plurality of auto precharge signals in response to the test mode enable signal, one of the plurality of internal address signals, the plurality of buffered bank address signals, auto precharge control signal, and one of the internal command signals of the semiconductor memory device. A precharge unit generates a plurality of bank precharge signals and bank precharge summation signal in response to the test mode enable signal, one of the plurality of internal address signals, the plurality of buffered bank address signals, the plurality of auto precharge signals, and one of the internal command signals of the semiconductor memory device. An internal clock generator generates first and second internal clocks when the test mode enable signal is enabled, and composes the test mode enable signal, the bank precharge summation signal, and one of the internal command signals of the semiconductor memory device and then generates a plurality of internal command control signals which synchronously respond to the first and second internal clock signals, wherein the command signal decoder composes the plurality of internal control signals and the reversed test mode enable signal and generates the internal command signals of the semiconductor memory device in response to the plurality of internal command control signals.

According to another aspect of this invention, there is provided a method for generating internal command signals in a semiconductor memory device, the method including: generating a plurality of internal control signals, a plurality of internal address signals, and a plurality of buffered bank address signals in response to external clock signal of a test equipment, a plurality of external control signals, a plurality of address signals, and a plurality of bank address signals; generating a test mode enable signal and a reversed test mode enable signal in response to a flag signal for precharging all the bank of the plurality of internal address signals; generating first and second internal clock signals when the test mode enable signal is enabled; composing the reversed test mode enable signal and the plurality of internal control signals and then generating internal command signals of the semiconductor memory device;

composing the test mode enable signal, one of the plurality of internal address signals, the plurality of buffered bank address signals, auto precharge control signal, and one of the internal command signals of the semiconductor memory device and then generating a plurality of auto precharge signals; composing the test mode enable signal, one of the plurality of internal address signals, the plurality of buffered bank address signals, the plurality of auto precharge signals, and one of the internal command signals of the semiconductor memory device, and then generating a plurality of bank precharge signals and bank precharge summation signal; and composing the test mode enable signal, the bank precharge summation signal, and one of the internal command signals of the semiconductor memory device and then generating a plurality of internal command control signals which synchronously respond to the first and second internal clock signals.

The foregoing features and advantages of the invention will be more fully explained, referring to the accompanying drawings.

BRIEF DESCRIPTION OF THE DRAWINGS

The inventions claimed herein will be explained and supported by the following detailed description when read in conjunction with the accompanying drawings in which:

DETAILED DESCRIPTION

This detailed description describes a presently preferred embodiment supporting claimed inventions. It is merely illustrative and it should not be taken in a limiting sense. In the following detailed description, various specific and detailed arrangements are described in order to provide a thorough understanding of the present invention. It will be apparent, however, to one skilled in the art that the present invention may be practiced without these specific details or using a different detailed arrangement.

Figure 2:
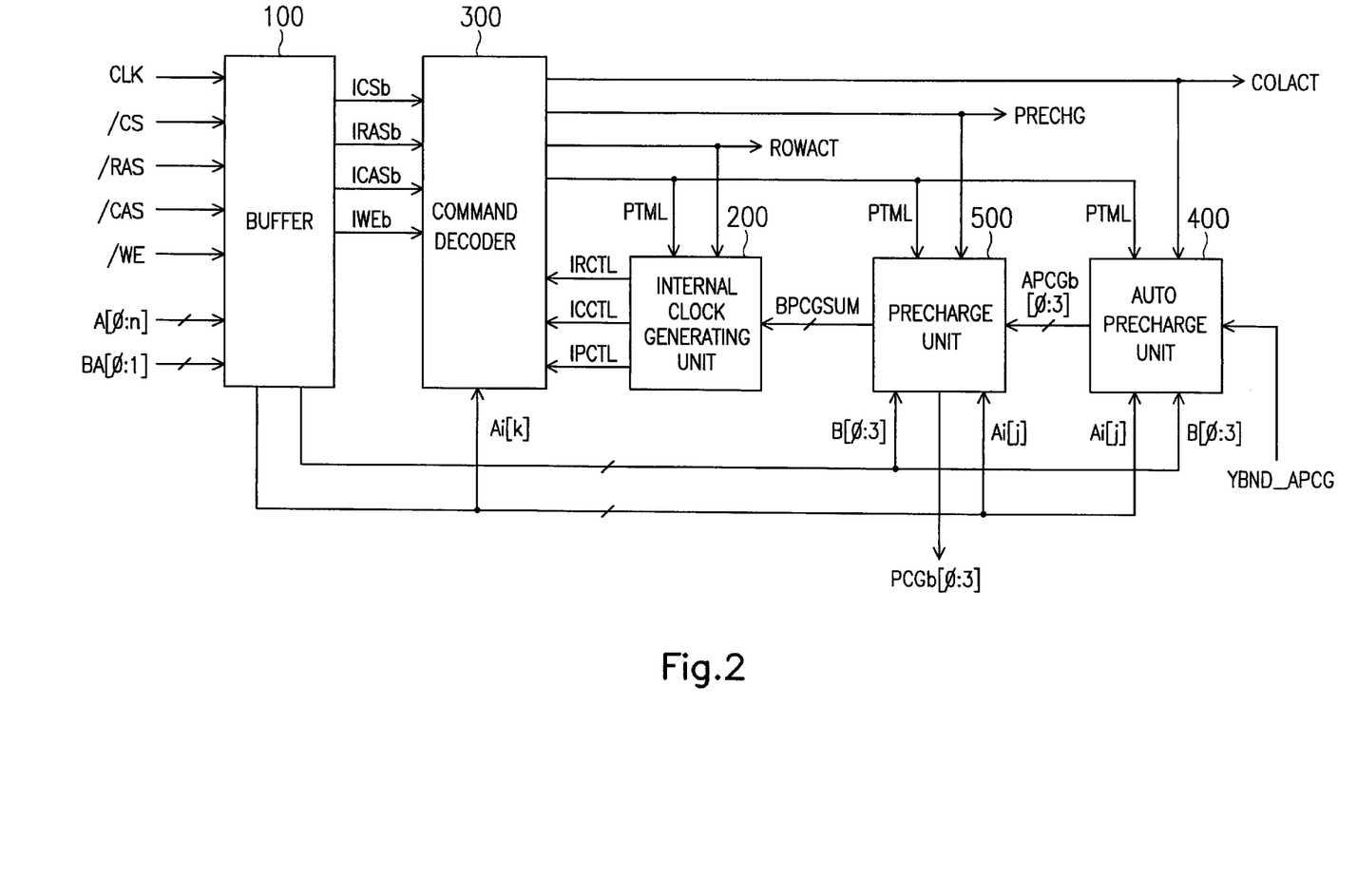
FIG. 2 is a block diagram showing an internal command signal generating circuit of the semiconductor memory device according to a preferred embodiment of the present invention.

FIG. 2 shows an internal command signal generating circuit according to a preferred embodiment of the present invention. First, symbols shown in FIG. 2 are explained.

Symbols indicated as ICSb, IRASb, ICASb, and IWEb are respectively buffered signals corresponding to external control signals /CS, /RAS, /CAS, and /WE provided from the outside, which, in this configuration, become high when the external control signals /CS, /RAS, /CAS, and /WE become low at a rising edge of external clock signal CLK of a test equipment.

Ai[0:n] are buffered signals of address signals A[0:n] of dynamic random access memory(DRAM), which become low when the DRAM address signals A[0:n] provided from the outside goes low, and goes high when the address signals A[0:n] goes high at the rising edge of the external clock signal CLK.

B[0:3] are buffered signals of bank address signals BA[0:1]. B[0] goes high when both of the bank address signals BA[0] and BA[1] go low level at the rising edge of the external clock signal CLK, and B[1] goes high when the bank address signals BA[0], and BA[1] are respectively high and low levels at the rising edge of the external clock signal CLK. B[2] goes high when the bank address signals BA[0] and BA[1] are respectively low and high at the rising edge of the external clock signal CLK. B[3] goes high when both of the bank address signals BA[0], and BA[1] go high at the rising edge of the external clock signal CLK.

In case that the external control signals such as chip selection signal /CS, row address strobe signal /RAS, and column address strobe signal /CAS, and write enable signal /WE are at high, high, low, and low levels respectively, row active command signal ROWACT goes up to a high level, informing of a precharge command signal input mode of synchronous DRAM operating modes.

In case that the external chip selection signal /CS, the external row address strobe signal /RAS, the external column address strobe signal /CAS are at high, low, and high levels respectively, column active command signal COLACT goes up to a high level, informing of a read or write command signal input mode of synchronous DRAM operating modes.

In case that the external chip selection signal /CS, the external row address strobe signal /RAS, the external column address signal /CAS and the external write enable signal /WE are at high, high, low, and high levels respectively, precharge command signal PRECHG goes up to a high level, informing of the precharge command signal input mode of the synchronous DRAM operating modes.

Operation of the internal command signal generating circuit shown in FIG. 2 will now be explained in detail. The internal command signal generating circuit includes buffer 100, internal clock generating unit 200, command signal decoder 300, auto precharge unit 400, and precharge unit 500.

The buffer 100 buffers the external clock signal CLK of the test equipment, the external control signals /CS, /RAS, /CAS, and /WE, the plurality of DRAM address signals A[0:n], and the plurality of bank address signals BA[0:1], and then generates the internal control signals ICSb, IRASb, ICASb, and IWEb, the plurality of internal address signals Ai[0:n], and the buffered bank address signals B[0:3]. Further, the internal clock generating unit 200 generates internal command control signals IRCTL, ICCTL, and IPCTL for controlling internal command signals of the DRAM when test mode enable signal PTML is at a high level.

Figure 3A:
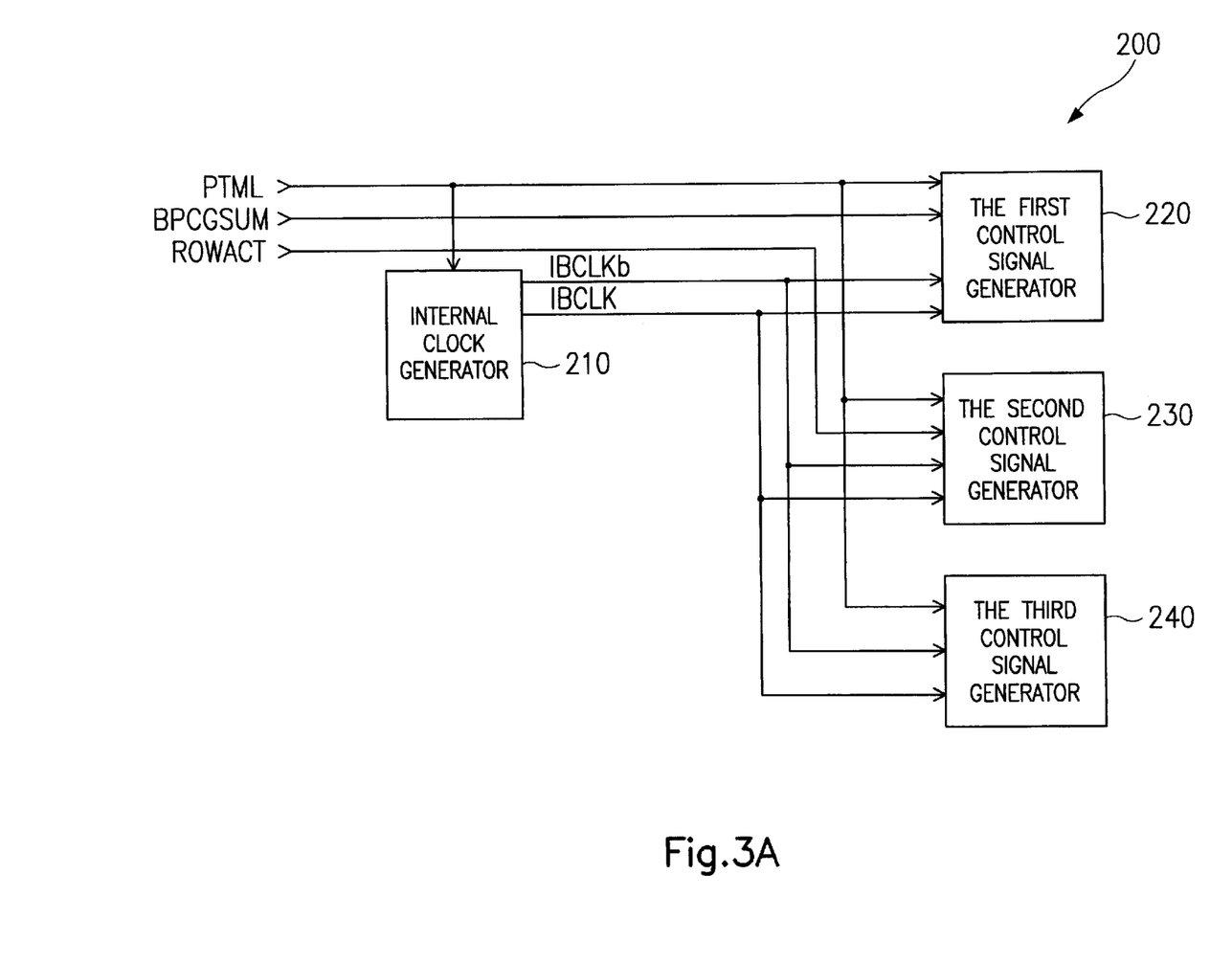
FIGS. 3A through 3C are circuit diagrams showing details of internal clock generating unit 200 shown in FIG. 2.
Figure 3B:
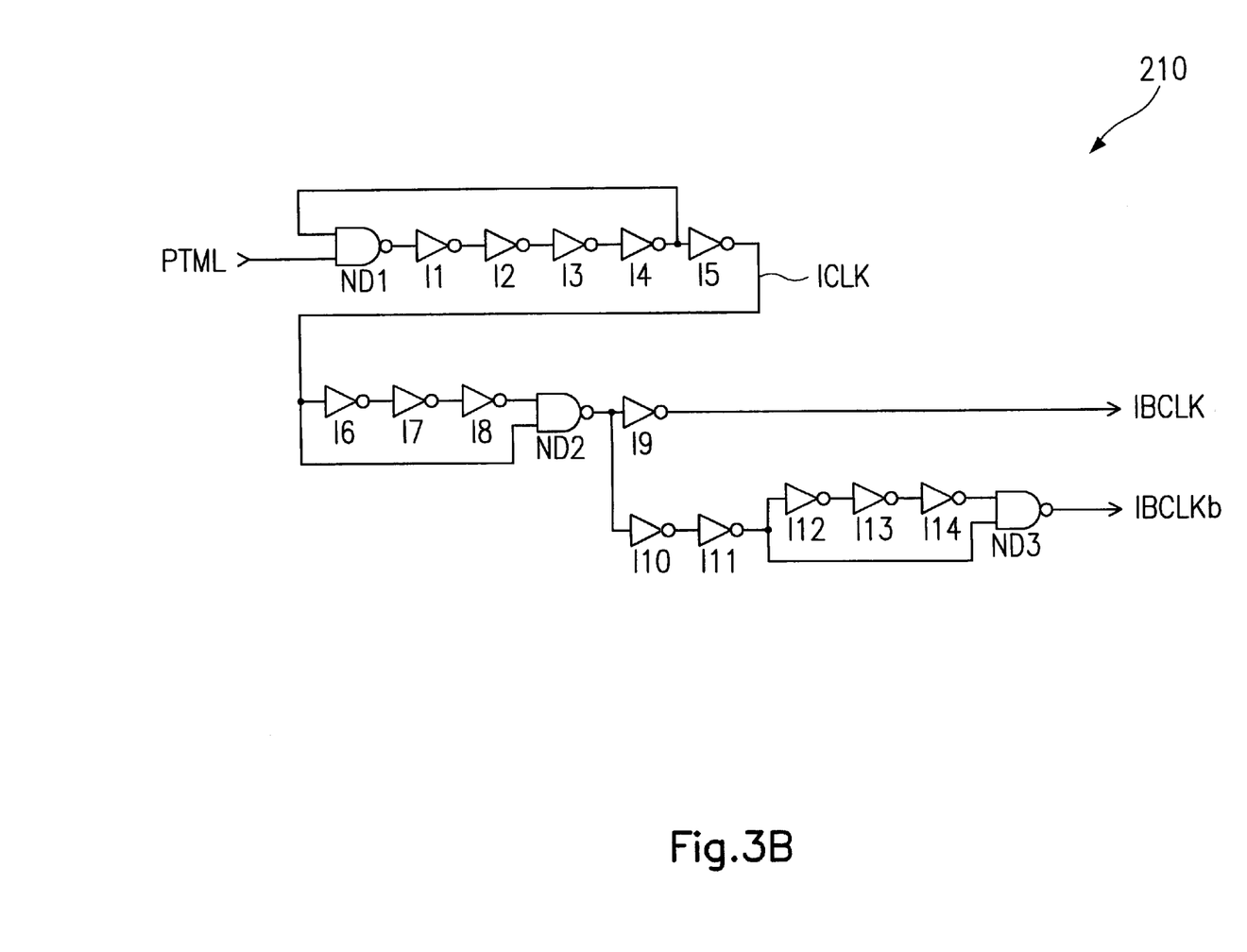
Figure 3C:
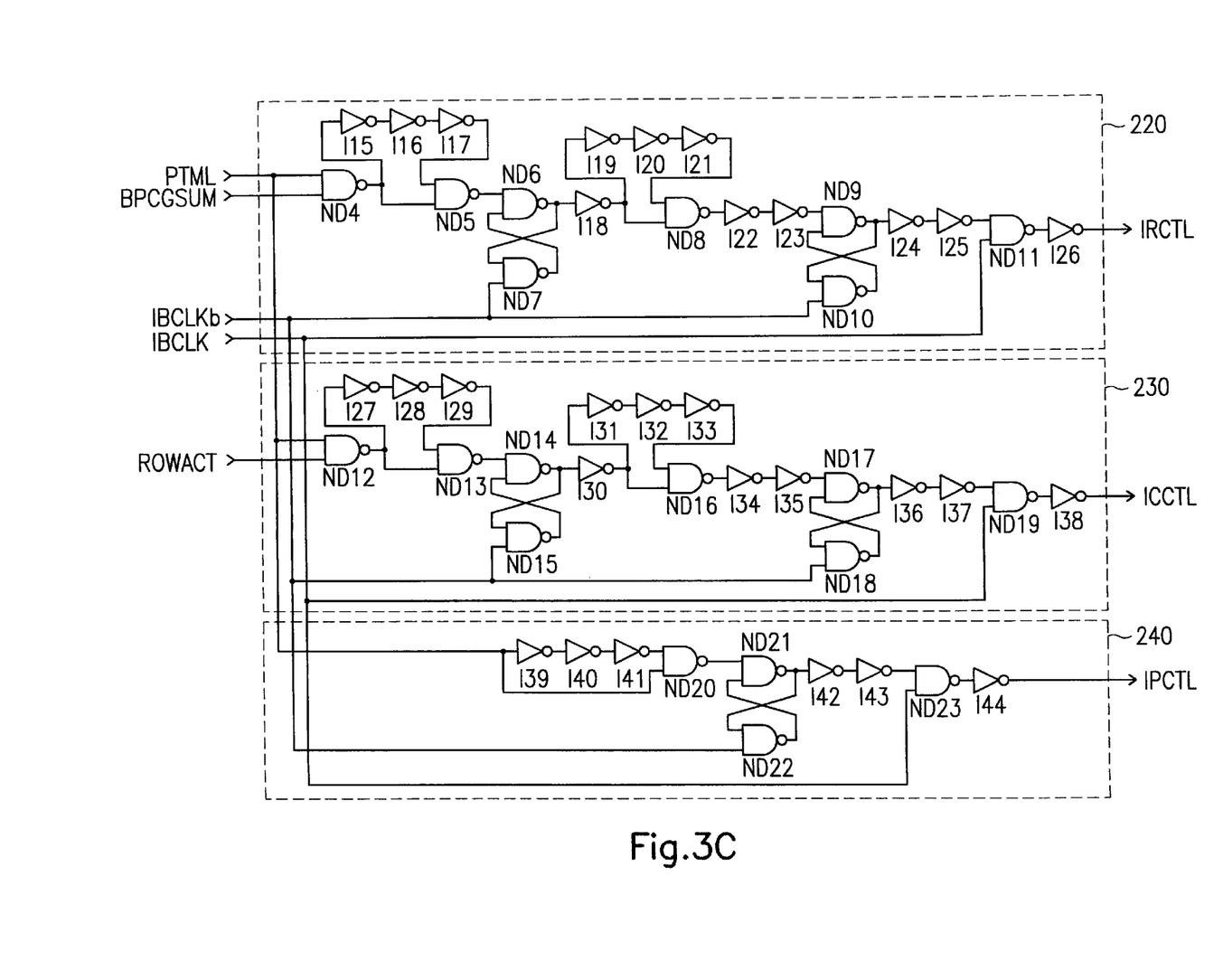

The internal clock generating unit 200 shown in FIG. 2 will be explained in detail with reference to FIGS. 3A through 3C. FIG. 3A is a block diagram of the internal clock generating unit 200, and FIGS. 3B and 3C are circuit diagrams of the internal clock generating unit 200.

The internal clock generating unit 200 shown in FIG. 3A includes internal clock generator 210, a first control signal generator 220, a second control signal generator 230, and a third control signal generator 240.

The internal clock generator 210 generates a first internal clock signal for controlling an operating mode of the synchronous DRAM in a predetermined interval of a square-wave cycle, when the test mode enable signal PTML (described below) is composed of the internal control signals ICSb, IRASb, ICASb, and IWEb, and then generates a second and third internal clock signals IBCLK and IBCLKb which synchronously respond to the first internal clock signal.

The first control signal generator 220 receives the test mode enable signal PTML and bank precharge summation signal BPCGSUM (described below), and generates row active control signal for controlling row active command signal synchronously responsive to the second and third internal clock signals IBCLK and IBCLKb.

The second control signal generator 230 receives the test mode enable signal PTML and the row active command signal ROWACT (described below), and then generates column active control signal for controlling column active command signal in synchronously response to the second and third internal clock signals IBCLK, and IBCLKb.

The third control signal generator 240 generates precharge control signal for controlling precharge command signal in synchronously response to the second and third internal clock signals IBCLK and IBCLKb when the test mode enable signal PTML is at a high level.

The internal clock generator 210 shown in FIG. 3B includes NAND gate ND1 performing logic operation for the test mode enable signal PTML and a feedback signal, a plurality of inverters I1 through I5 continuously reversing the output signal of the NAND gate ND1 and then generating a first internal clock signal ICLK, and a plurality of inverters I6~I8 continuously reversing the output signal of the inverter I5. Further, NAND gate ND2 performs the logic operation in response to the output signals of the inverters I5 and I8, and inverter I9 reverses the output signal of the NAND gate ND2 and then generates a second internal clock signal IBCLK. A plurality of inverters I10~I14 continuously reverse the output signal of the NAND gate ND2, and NAND gate ND3 performs the logic operation for the output signals of the inverters I11 and I14 and then generates a third internal clock signal IBCLKb.

The internal clock generator 210, when the test mode enable signal PTML is at a high level, generates the first internal clock signal ICLK of the square-wave having shorter cycle than that of external clock signal of the test equipment, the second internal clock signal IBCLK in synchronously response to a rising edge of the first internal clock signal ICLK, and the third internal clock signal IBCLKb in synchronously response to a falling edge of the second internal clock signal IBCLK.

In the first control signal generator 220 shown in FIG. 3C, NAND gate ND4 performs the logic operation in response to the test mode enable signal PTML and the bank precharge summation signal BPCGSUM, and a plurality of inverters I15, I16, and I17 continuously reverse the output signal of the NAND gate ND4. NAND gate ND5 performs the logic operation in response to the output signals of the NAND gate ND4 and the inverter I17. Further, latch circuits ND6 and ND7 latch the output signal of the NAND gate ND5 and the third internal clock signal IBCLKb. A plurality of inverters I18, I19, I20, and I21 continuously reverses the output signals of the latch circuits ND6 and ND7. NAND gate ND8 performs the logic operation in response to the output signals of the inverters I18 and I21. A plurality of inverters I22 and I23 continuously reverse the output signal of the NAND gate ND8, and latch circuits ND9 and ND10 latch the output signal of the inverter I23 and the third internal clock signal IBCLKb. A plurality of inverters I24 and I25 continuously reverse the output signals of the latch circuits ND9 and ND10, and NAND gate ND11 performs the logic operation in response to the output signal of the inverter I25 and the second internal clock signal IBCLK. Inverter I26 reverses the output signal of the NAND gate ND11 and then generates the row active control signal IRCTL for controlling the row active command signal.

When the test mode enable signal PTML is at a high level, the first control signal generator 220 generates the row active control signal IRCTL in synchronously response to the rising edge of the first internal clock signal ICLK at a point of N+2 if at least one bank is precharged in synchronously response to the rising edge of the first internal clock signal ICLK at a predetermined point of N.

The second control signal generator 230 shown in FIG. 3C is similar to the aforementioned first control signal generator 220 except that column active control signal ICCTL is generated in response to the row active command signal ROWACT instead of the bank precharge summation signal BPCGSUM.

When the test mode enable signal PTML is at a high level, the second control signal generator 230 generates the column active control signal ICCTL in synchronously response to the rising edge of the first internal clock signal ICLK at the point of N+2 if the row active command signal ROWACT is generated in synchronously response to the rising edge of the first internal clock signal ICLK at the predetermined point of N.

The third control signal generator 240 shown in FIG. 3c includes a plurality of inverters I39, I40, I41 continuously reversing the test mode enable signal PTML, and NAND gate ND 20 performing the logic operation in response to the output signal of the inverter I41 and the test mode enable signal PTML. Latch circuits ND21 and ND22 latch the output signal of the NAND gate ND20 and the third internal clock signal IBCLKb, and inverters I42 and I43 continuously reverse the output signal of the latch circuits ND21 and ND22. NAND gate ND23 performs the logic operation in response to the output signal of the inverter I43 and the second internal clock signal IBCLK, and inverter I44 reverses the output signal of the NAND gate ND23, and then generates precharge control signal IPCTL for controlling precharge command signal.

The third control signal generator 240 generates the precharge control signal IPCTL with only one pulse in synchronously response to the first internal clock signal ICLK when the test mode enable signal PTML is enabled to high level.

As the foregoing description, the internal command signal generating circuit generates the first internal clock signal ICLK capable of controlling an operating mode of the synchronous DRAM at regular intervals. Here, the clock cycle time of the signal ICLK is shorter than that of the external clock signal of the test equipment. Further, the internal clock generators shown in FIGS. 3A~3B generate the internal command control signals IRCTL, ICCTL, and IPCTL to control the internal command signals ROWACT, COLACT, and PRECHG of the DRAM in synchronously response to the first internal clock signal ICLK. As a result, the circuit of the present invention can remarkably reduce the testing time as compared with the conventional circuit shown in FIG. 1.

Figure 4:
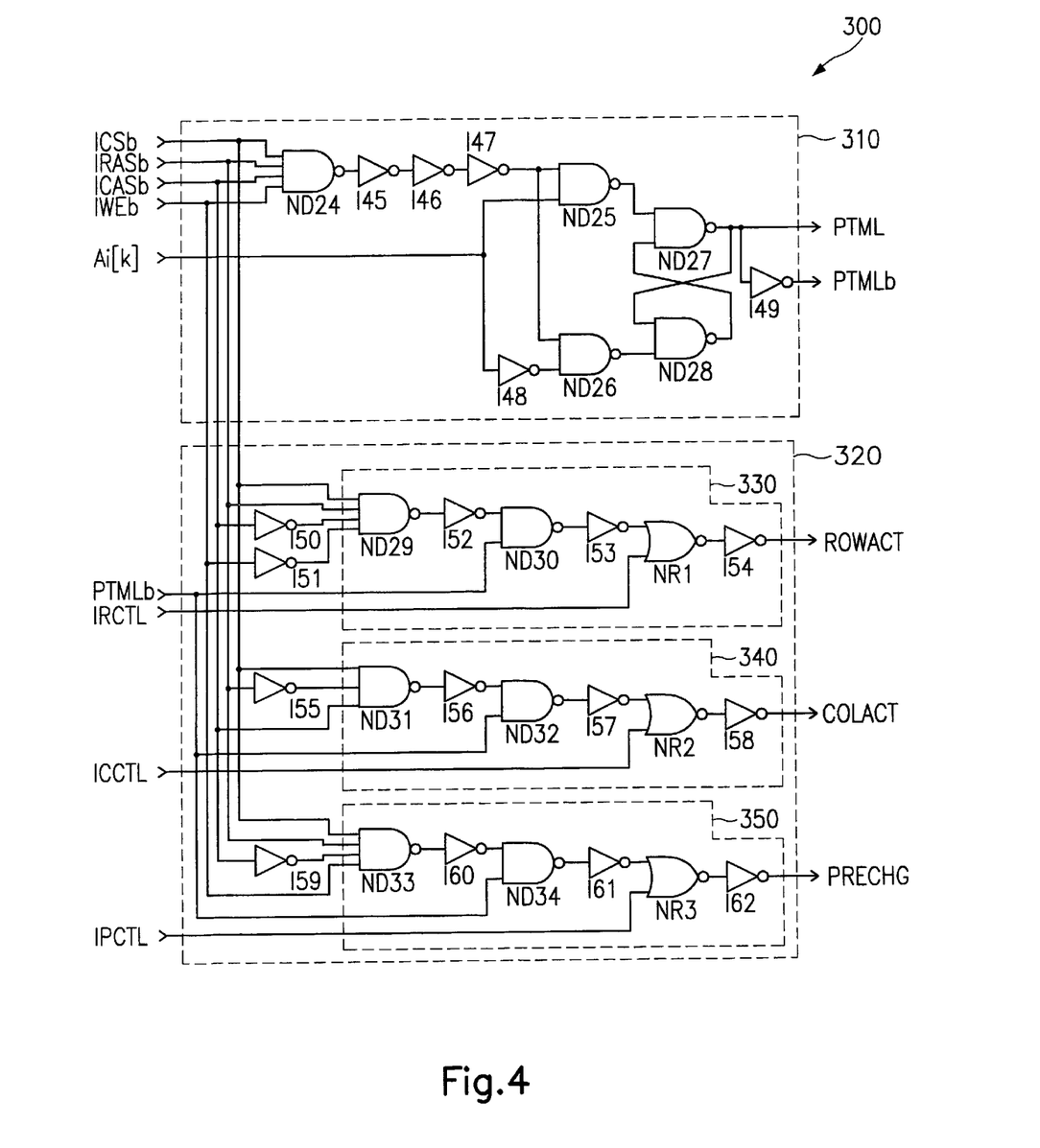
FIG. 4 is a circuit diagram showing details of a command signal decoder 300 shown in FIG. 2.

Next, the command signal decoder 300 shown in FIG. 2 will be explained in detail with reference to FIG. 4. The command signal decoder 300 includes test mode enable unit 310, and internal command signal generating unit 320. The test mode enable unit 310 composes the plurality of internal control signals ICSb, IRASb, ICASb and IWEB in response to the flag signal Ai[k] for precharging all the bank, and then generates the test mode enable signal PTML and the reversed test mode enable signal PTMLb. The internal command signal generating unit 320 receives the plurality of internal control signals ICSb, IRASb, ICASb, and IWEb and the reversed test mode enable signal PTMLb in response to the internal command control signals IRCTL, ICCTL, and IPCTL for controlling the internal command signal of the semiconductor device, and generates the internal command signals ROWACT, COLACT, and PRECHG of the semiconductor memory device which synchronously respond to the first internal clock signal ICLK.

The test mode enable unit 310 includes NAND gate ND24 performing the logic operation in response to the reversed internal chip selection signal ICSb, the reversed internal row address strobe signal IRASb, the reversed internal column address strobe signal ICASb, and the reversed internal write enable signal IWEb. A plurality of inverters I45, I46, and I47 continuously reverse the output signal of the NAND gate ND24. NAND gate ND25 performs the logic operation in response to the output signal of the inverter I47 and one of the plurality of internal addresses, i.e., the flag signal Ai[k] for precharging all the bank. Inverter I48 reverses the flag signal Ai[k] for precharging all the bank, and NAND gate ND26 performs the logic operation in response to the output signals of the inverters I47 and I48. Latch circuits ND27 and ND28 latches the output signals of the NAND gate ND25 and ND26 and generate the test mode enable signal PTML, and inverter I49 reverses the output signal of the latch circuits ND27 and ND28, and generates the reversed test mode enable signal PTMLb.

The test mode enable unit 310 buffers the external control signals /CS, /RAS, /CAS, and /WE and the DRAM address signal A[k] and then generates the test mode enable signal PTML and the reversed test mode enable signal PTMLb to control the first internal clock signal ICLK.

The internal command signal generating unit 320 includes first command signal generator 330, second command signal generator 340, and third command signal generator 350.

The first command signal generator 330 receives an output signal of inverter I50 where the internal control signals ICSb, IRASb, and ICASb are reversed, an output signal of invert I51 where the reversed internal write enable signal IWEb is reversed, and the reversed test mode enable signal PTMLb, and generates the row active command signal ROWACT in response to the row active control signal IRCTL.

The second command signal generator 340 receives an output signal of inverter I55 where the internal control signals ICSb, and IRASb are reversed, the reversed internal column address strobe signal ICASb, and the reversed test mode enable signal PTMLb, and generates the column active command signal COLACT in response to the column active control signal ICCTL.

The third command signal generator 350 receives an output signal of inverter I59 where the internal control signals ICSb, IRASb, ICASb are reversed, the reversed internal write enable signal IWEb, and the reversed test mode enable signal PTMLb, and generates the precharge command signal PRECHG in response to the precharge control signal IPCTL.

In the first command signal generator 330, the inverter I50 reverses the reversed internal column address strobe signal ICASb, and the inverter I51 reverses the reversed internal write enable signal IWEb. NAND gate ND29 performs the logic operation in response to the reversed internal chip selection signal ICSb, the reversed internal row address strobe signal IRASb, internal column address strobe signal as the output signal of the inverter I50, and internal write enable signal as the output signal of the inverter I51. Inverter I52 reverses the output signal of the NAND gate ND29, and NAND gate ND30 performs the logic operation in response to the output signal of the inverter I52 and the reversed test mode enable signal PTMLb. Inverter I53 reverses the output signal of the NAND gate ND30. NOR gate NR1 performs the logic operation in response to the output signal of the inverter I53 and the row active control signal IRCTL. Inverter I54 reverses the output signal of the NOR gate NR1, and then generates the row active command signal ROWACT.

In the second command signal generator 340, the inverter I55 reverses the reversed internal row address strobe signal IRASb, and NAND gate ND31 performs the logic operation in response to the reversed internal chip selection signal ICSb, the internal row address strobe signal as the output signal of the inverter I55, and the reversed internal column address strobe signal ICASb. Inverter I56 reverses the output signal of the NAND gate ND31, and NAND gate ND32 performs the logic operation in response to the output signal of the inverter I56 and the reversed test mode enable signal PTMLb. Inverter I57 reverses the output signal of the NAND gate ND32, and NOR gate NR2 performs the logic operation in response to the output signal of the inverter I57 and the column active control signal ICCTL. Inverter I58 reverses the output signal of the NOR gate NR2, and then generates the column active command signal COLACT.

In the third command signal generator 350, the inverter I59 reverses the reversed internal column address strobe signal ICASb, and NAND gate ND33 performs the logic operation in response to the reversed internal chip selection signal ICSb, the reversed internal row address strobe signal IRASb, the internal column address strobe signal as the output signal of the inverter I59, and the reversed internal write enable signal IWEb. Inverter I60 reverses the output signal of the NAND gate ND33, and NAND gate ND34 performs the logic operation in response to the output signal of the inverter I60 and the reversed test mode enable signal PTMLb. Inverter I61 reverses the output signal of the NAND gate ND34, and NOR gate NR3 performs the logic operation in response to the output signal of the inverter I61 and the precharge control signal IPCTL. Inverter I62 reverses the output signal of the NOR gate NR3 and then generates the precharge command signal.

Here, the NAND gates ND30, ND32, and ND34 serve to prevent the row active command signal ROWACT, the column active command signal COLACT, and the precharge command signal PRECHG from being controlled by a level status of the external control signals /CS, /RAS, /CAS, and /WE when the test mode enable signal PTML is at a high level.

The NOR gates NR1, NR2, and NR3 generate the row active command signal ROWACT, the column active command signal COLACT, and the precharge command signal PRECHG in response to the row active control signal IRCTL, the column active control signal ICCTL, and the precharge control signal IPCTL generated in synchronously response to the rising edge of the first internal clock signal ICLK, when the test mode enable signal PTML is at a high level.

Figure 5:
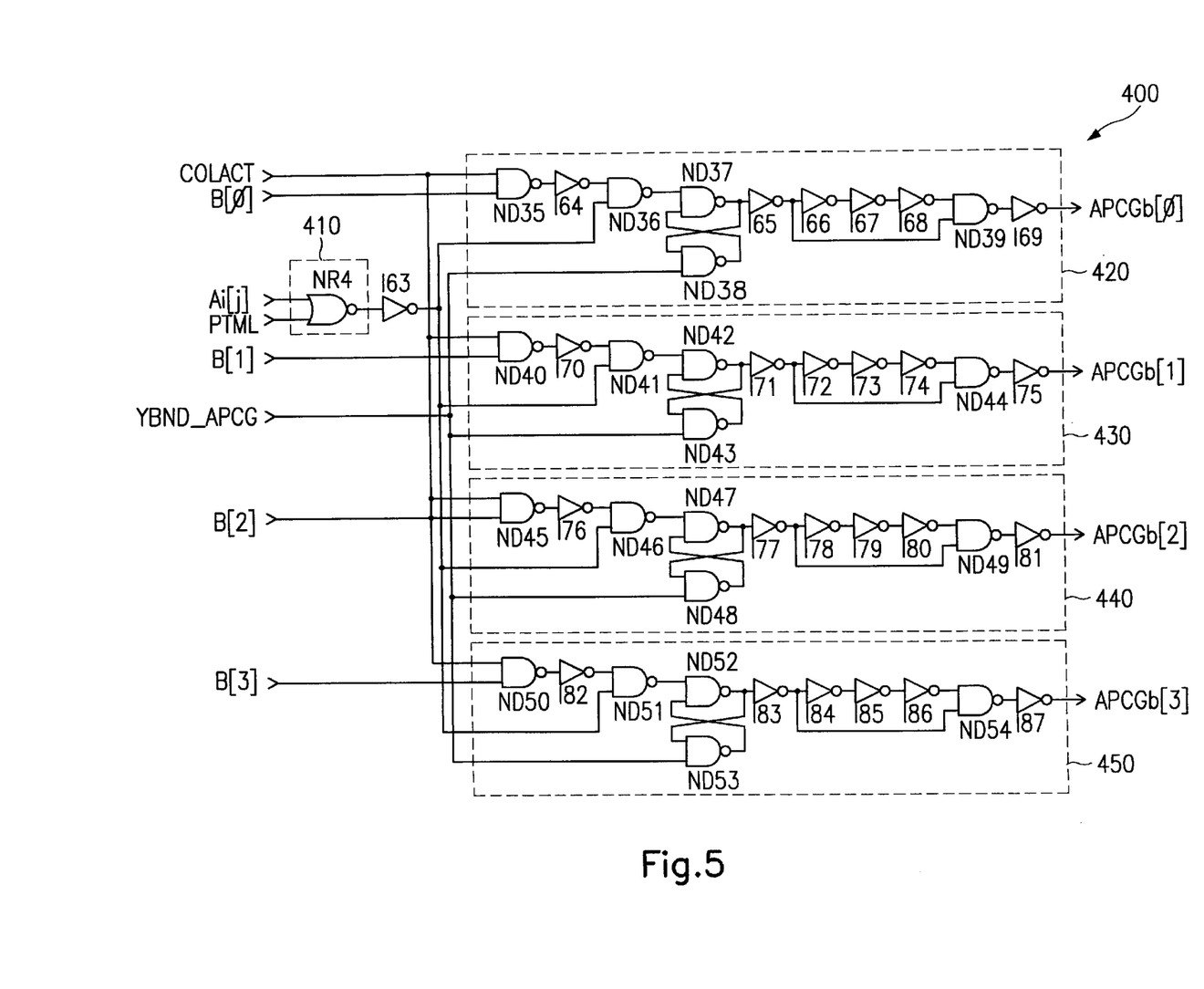
FIG. 5 is a circuit diagram showing details of auto precharge unit 400 shown in FIG. 2.

The auto precharge unit 400 shown in FIG. 2 is explained with reference to FIG. 5 hereinafter. The auto precharge unit 400 includes auto precharge setting unit 410, and the first through fourth auto precharge signal generating units 420, 430, 440, and 450. The auto precharge setting unit 410 sets up to achieve the auto precharge operation in the read or write mode, when the test mode enable signal PTML is at a high level. The first through fourth auto precharge signal generating units 420, 430, 440, and 450 generate the auto precharge signals APCGb[0:3] in response to an output signal of inverter I63 where the output signal of the auto precharge setting unit 410 is reversed, the column active command signal COLACT, the buffered bank address signals B[0:3], and auto precharge control signal YBND_APCG. The auto precharge control signal YBND_APCG controls an operation of the auto precharge, after a burst operation of read or write for one memory bank region is completed.

The auto precharge setting unit 410 is formed of NOR gate NR4 which performs the logic operation in response to one of internal address signals Ai[j] and the test mode enable signal PTML.

In the auto precharge signal generating unit 420, NAND gate ND35 performs the logic operation in response to the column active command signal COLACT, and the buffered bank address signal B[0], and inverter I64 reverses the output signal of the NAND gate ND35. NAND gate ND36 performs the logic operation in response to the output signals of the inverters I63 and I64, and latch circuits ND37 and ND38 latch the output signal of the NAND gate ND36 and the auto precharge control signal YBND_APCG. A plurality of inverters I65, I66, I67, and I68 continuously reverse the output signals of the latch circuits ND37 and ND38. NAND gate ND39 performs the logic operation in response to the output signals of the inverters I65 and I68, and inverter I69 reverses the output signal of the NAND gate ND39 and then generates a first auto precharge signal APCGb[0].

Since the rest of the auto precharge signal generating units 430, 440, and 450 have the same configuration with the first auto precharge signal generating unit 401, further description thereof will be omitted here.

The auto precharge unit 400 generates the auto precharge signals APCGb[0:3] in response to the test mode enable signal PTML, one of internal address signals Ai[j], the column active command signal COLACT, the buffered bank address signal B[0:3], and the auto precharge control signal YBND_APCG. The auto precharge signals APCGb[0:3] serves to determine whether or not the auto precharge is achieved, after a burst operation of read or write for one memory bank region is completed by one of the internal address signals Ai[j].

Here, the auto precharge is an operating mode that a precharge operation for one memory bank is achieved in the DRAM, even though a precharge command signal mode is not provided from the outside after the burst operation of the read or write is completed.

Figure 6:
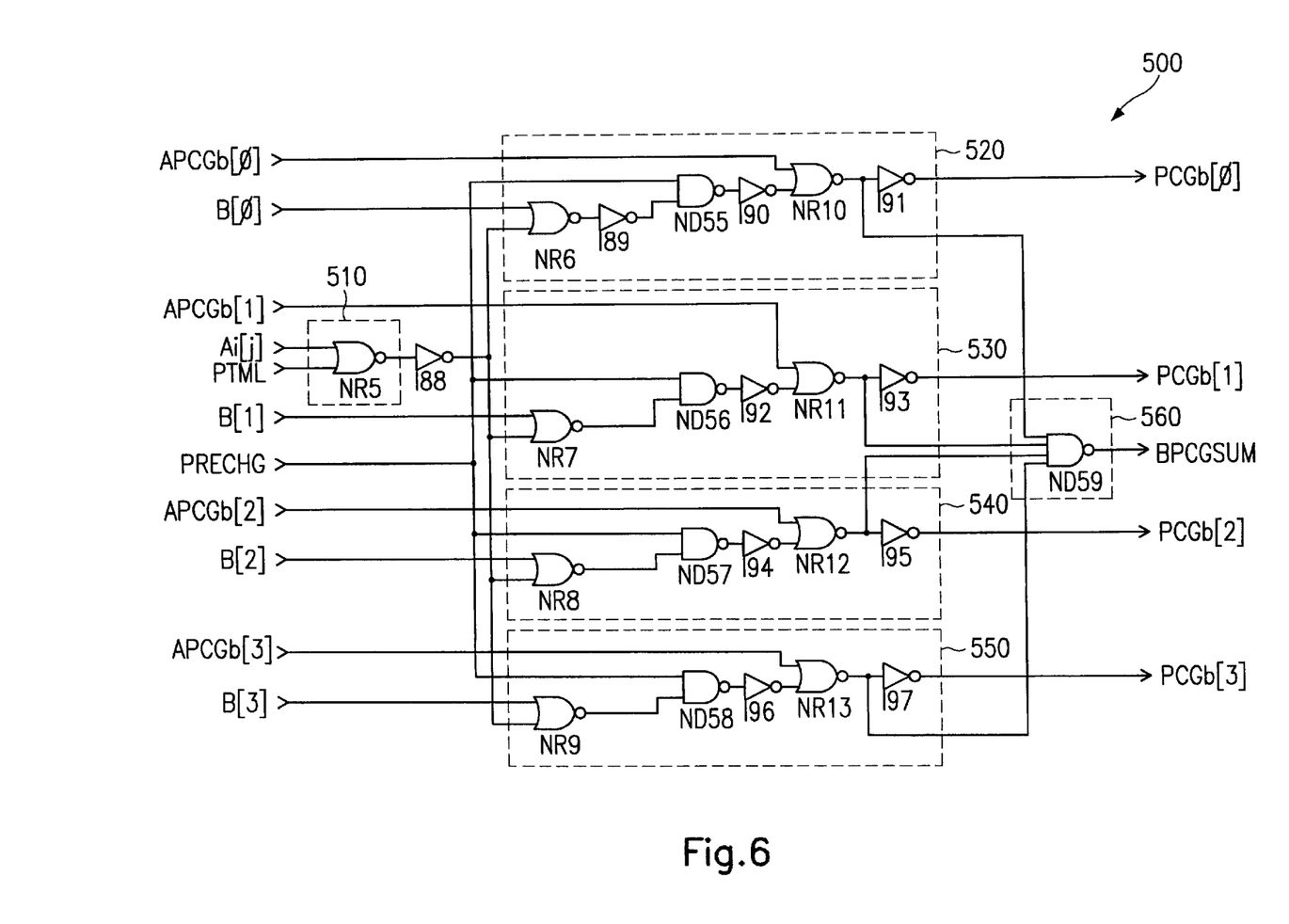
FIG. 6 is a circuit diagram showing details of precharge unit 500 shown in FIG. 2.

Next, the precharge unit 500 shown in FIG. 2 will be explained in detail with reference to FIG. 6. Tthe precharge unit 500 generates the bank precharge signals PCGb[0:3] and the bank precharge summation signal BPCGSUM in response to one of internal address signals Ai[j], the test mode enable signal PTML, the auto precharge signals APCGb[0:3], the precharge command signal PRECHG; and the buffered bank address signals B[0:3].

The bank precharge signal PCGb[0:3] is decoded signal of the precharge command signal PRECHG with the buffered bank address signals B[0:3]. Briefly, the bank precharge signals PCGb[0:3] serves to respectively precharge the banks 0~3.

For instance, in case of precharging the bank 0, only the buffered bank address signal B[0] goes up to a high level, resulting in conducting only the bank precharge signal B[0] to a high level. In case of precharging all the banks, one of the internal address signals Ai[k], i.e., the flag signal for synchronously precharging all the banks without respect to a decoding of the buffered bank address signals B[0:3] goes up to a high level for the precharge command signal PRECHG to be at a high level. Thus, all the bank precharge signals B[0:3] go up to a high level.

The precharge unit 500 includes bank precharge determination unit 510, first through fourth bank precharge signal generating units 520~550, and bank precharge signal summation unit 560. The bank precharge determination unit 510 performs the precharge for all the banks when the precharge command signal PRECHG is at a high level in response to the test mode enable signal PTML of a high level. The first through fourth bank precharge signal generating units 520~550 generate the bank precharge signals PCG[0:3] in response to an output signal provided from inverter I88 where the output signal of the bank precharge determination unit 510 is reversed, the precharge command signal PRECHG, the auto precharge signals APCGb[0:3], and the buffered bank address signals B[0:3]. The bank precharge signal summation unit 560 performs the logic operation for the bank precharge signals PCGb[0:3] and then generates the bank precharge summation signal BPCGSUM.

Here, the bank precharge determination unit 510 is formed of NOR gate NR5 performing the logic operation of one of the internal address signals Ai[j] and the test mode enable signal PTML, and the bank precharge signal summation unit 560 is formed of NAND gate N59 performing the logic operation of the bank precharge signals PCGb[0:3].

In the first bank precharge signal generating unit 520, NOR gate NR6 performs the logic operation in response to the output signal of the inverter I88 and the buffered bank address signal B[0], and inverter I89 reverses the output signal of the NOR gate NR6. NAND gate ND55 performs the logic operation in response to the output signal of the inverter I89 and the precharge command signal PRECHG, and inverter I90 reverses the output signal of the NAND gate ND55. NOR gate NR10 performs the logic operation in response to the first auto precharge signal APCGb[0] and the output signal of the inverter I90, and inverter I91 generates the first bank precharge signal PCGb[0] in response to the output signal of the NOR gate NR10.

In the second bank precharge signal generating unit 530, NOR gate NR7 performs the logic operation in response to the output signal of the inverter I88 and the buffered bank address signal B[1], and NAND gate ND56 performs the logic operation in response to the output signal NR7 and the precharge command signal PRECHG. Inverter I92 reverses the output signal of the NAND gate ND56, and NOR gate NR11 performing the logic operation in response to the output signal of the inverter I92 and the second auto precharge signal APCGb[1]. Inverter I93 reverses the output signal of the NOR gate NR11 and then generates the second bank precharge signal PCGb[1].

Since the third and fourth bank precharge signal generating units 540 and 550 have the same configuration with the second bank precharge signal generating unit 530, a further description thereof will be omitted here.

In case that the test mode enable signal PTML is at a high level, the bank precharge determination unit 510 operates for all the banks to be precharged when one of the internal address signal Ai[j] and the precharge command signal PRECHG are at a high level. The bank precharge signal summation unit 560 operates for logic level of the bank precharge summation signal BPCGSUM to transition, in case that logic level of at least one of the bank precharge signals PCGb[0:3] is subject to the transition.

Figure 7:
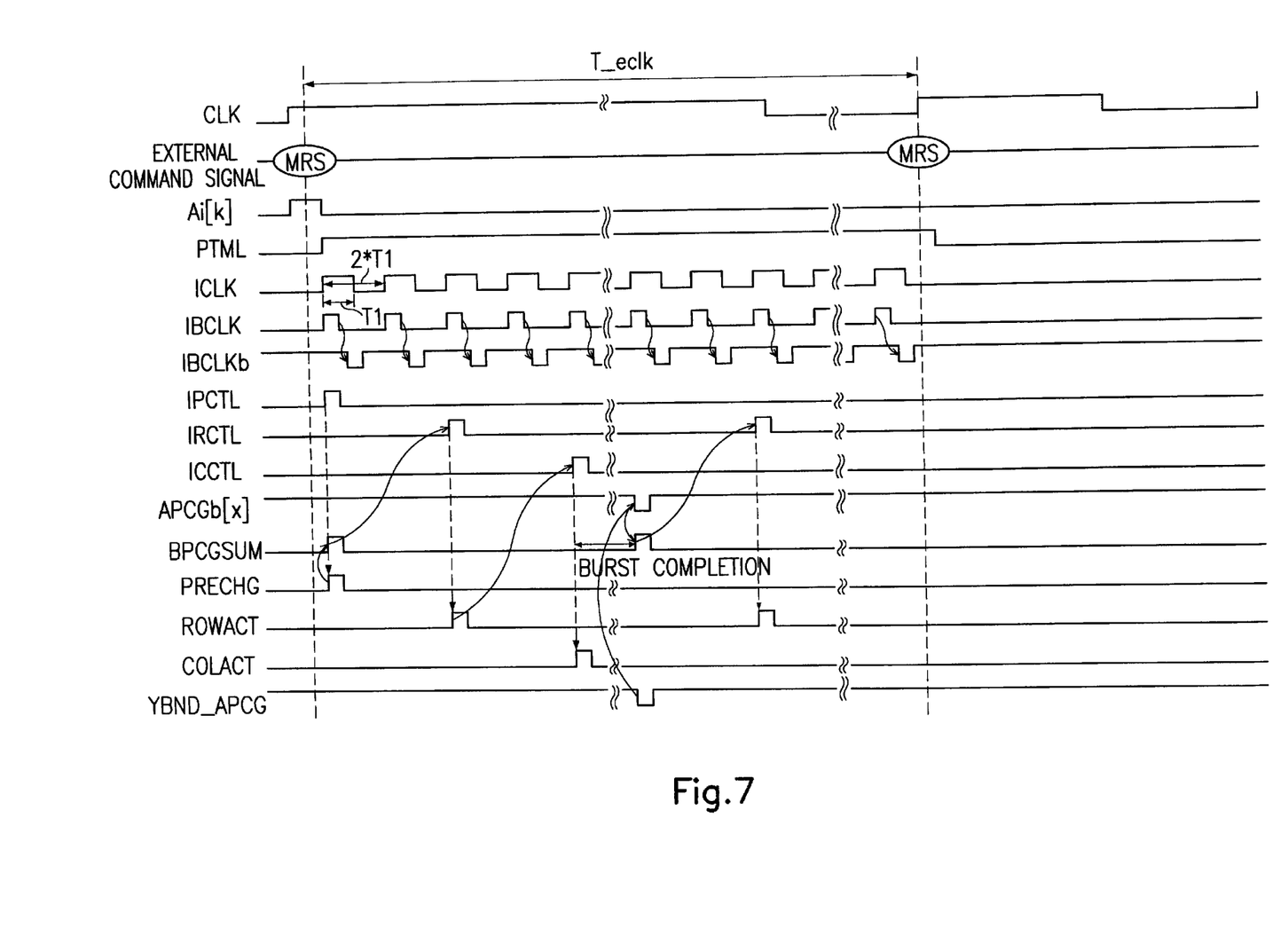
FIG. 7 is a timing diagram explaining operation of claimed inventions.

FIG. 7 is timing diagram showing the signals applied to the internal command signal generating circuit. The clock cycle time (2×T1) of the first internal clock signal ICLK is far shorter than the cycle time (T_eclk) of the external clock signal CLK of the test equipment. Thus, the command signal testing time of the DRAM can be remarkably reduced.

As the foregoing description, the internal command signal generating circuit of the present invention generates the first internal clock signal ICLK whose predetermined clock cycle time (2×T1) is shorter than that (T_eclk) of the external clock signal of the test equipment, and then the second and third internal clock signals IBCLK and IBCLb in synchronously response to the first internal clock signal ICLK. The internal command signals ROWACT, COLACT, and PRECHG are generated in response to the internal command control signals IRCTL, ICCTL, and IPCTL being generated in synchronisely response to the second and third internal clock signals IBCLK and IBCLb. As a result, the command signal testing time in the DRAM can be remarkably reduced.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A circuit for generating an internal command signal in a semiconductor memory device, the circuit comprising:
   a buffer for generating a plurality of internal control signals and internal address signals in response to external clock signal of a test equipment, a plurality of external control signals, and a plurality of address signals;
   a command signal decoder for composing the plurality of internal control signals and then generating a test mode enable signal and a reversed test mode enable signal in response to a flag signal for precharging all the bank of the plurality of internal address signals, and composing the reversed test mode enable signal and the plurality of internal control signals and then generating internal command signals of the semiconductor memory device; and
   an internal clock generating means for generating a first and second internal clocks when the test mode enable signal is enabled, and composing the test mode enable signal and one of the internal command signals of the semiconductor memory device and then generating a plurality of internal command control signals which synchronously respond to the first and second internal clock signals;
   wherein the command signal decoder compose the plurality of internal control signals and the reversed test mode enable signal and then generates the internal command signals of the semiconductor memory device, in response to the plurality of internal command control signals.

2. The circuit of claim 1, wherein the internal clock generating means generates a third internal clock signal where the cycle time is shorter than that of the external clock signal of the test equipment when the test mode enable signal provided by the command signal decoder is enabled, and generates the first and second internal clock signals in synchronously response to the third internal clock signal.

3. The circuit of claim 1, wherein the command signal decoder comprises:
   a test mode enable unit for composing the plurality of internal control signals and then generating the test mode enable signal and the reversed test mode enable signal, in response to the flag signal for precharging all the banks of the plurality of internal address signals; and
   an internal command signal generating unit for composing the reversed test mode enable signal and the plurality of internal control signals and then generating the internal command signals of the semiconductor memory device, in response to the plurality of the internal command control signals.

4. The circuit of claim 3, wherein the internal command signal generating unit comprises:
   a first command signal generating unit for composing the plurality of internal control signal and the reversed test mode enable signal and then generating row active command signal, in response to row active control signal of the internal command control signals;
   a second command signal generating unit for composing the plurality of internal control signals and the reversed test mode enable signal and then generating column active command signal, in response to column active control signal of the plurality of internal command control signals; and
   a third command signal generating unit for composing the plurality of internal control signals and the reversed test mode enable signal and then generating precharge command signal, in response to precharge control signal of the plurality of internal command control signals.

5. The circuit of claim 1, wherein the internal clock generating means comprises:
   an internal clock generator for generating the first and second internal clock signals when the test mode enable signal is enabled; and
   a control signal generating unit for receiving the test mode enable signal and one of the internal command signals of the semiconductor memory device and then generating the plurality of internal command control signals synchronously responsive to the first and second internal clock signals.

6. The circuit of claim 5, wherein the control signal generating unit comprises:
   a first control signal generating unit for receiving the test mode enable signal and then generating a row active control signal synchronously responsive to the first and second internal clock signals;
   a second control signal generating unit for receiving the test mode enable signal and one of the internal command signals of the semiconductor memory device and then generating column active control signal synchronously responsive to the first and second internal clock signals; and
   a third control signal generating unit for receiving the test mode enable signal and then generating precharge control signal synchronously responsive to the first and second internal clock signals.

7. A circuit for generating an internal command signal in a semiconductor memory device, the circuit comprising:
   a buffer for generating a plurality of internal control signals, a plurality of internal address signals, and a plurality of buffered bank address signals in response to external clock signal of a test equipment, a plurality of external control signals, a plurality of address signals, and a plurality of bank address signals;

a command signal decoder for composing the plurality of internal control signals and then generating a test mode enable signal and a reversed test mode enable signal in response to a flag signal for precharging all the bank of the plurality of internal address signals, and composing the reversed test mode enable signal and the plurality of internal control signals and then generating internal command signals of the semiconductor memory device;

an auto precharge means for generating a plurality of auto precharge signals in response to the test mode enable signal, one of the plurality of internal address signals, the plurality of buffered bank address signals, auto precharge control signal, and one of the internal command signals of the semiconductor memory device;

a precharge means for generating a plurality of bank precharge signals and bank precharge summation signal in response to the test mode enable signal, one of the plurality of internal address signals, the plurality of buffered bank address signals, the plurality of auto precharge control signals, and one of the internal command signals of the semiconductor memory device; and an internal clock generating means for generating first and second internal clock signals when the test mode enable signal is enabled, and composing the test mode enable signal, the bank precharge summation signal, and one of the internal command signals of the semiconductor memory device and then generating a plurality of internal command control signals which synchronously respond to the first and second internal clock signals;

wherein the command signal decoder composes the plurality of internal control signals and the reversed test mode enable signal and then generates the internal command signals of the semiconductor memory device, in response to the plurality of internal command control signals.

8. The circuit of claim 7, wherein the internal clock generating means generates a third internal clock signal where the cycle time is shorter than that of the external clock signal of the test equipment when the test mode enable signal provide from the command signal decoder is enabled, and then generates the first and second internal clock signals in synchronously response to the third internal clock signal.

9. The circuit of claim 7, wherein the command signal decoder comprises:

a test mode enable unit for composing the plurality of internal control signals and then generating the test mode enable signal and the reversed test mode enable signal, in response to the flag signal for precharging all the bank of the plurality of internal address signals, and an internal command signal generating unit for composing the reversed test mode enable signal and the plurality of internal control signals and then generating the internal command signals of the semiconductor memory device, in response to the plurality of internal command control signals.

10. The circuit of claim 9, wherein the internal command signal generating unit comprises:

a first command signal generating unit for composing the plurality of internal control signals and the reversed test mode enable signal and then generating row active command signal, in response to row active control signal of the plurality of internal command control signals;

a second command signal generating unit for composing the plurality of internal control signals and the reversed test mode enable signal and then generating column active command signal, in response to column active control signal of the plurality of internal command control signals; and a third command signal generating unit for composing the plurality of internal control signals and the reversed test mode enable signal and then generating precharge command signal, in response to precharge control signal of the plurality of internal command control signals.

11. The circuit of claim 7, wherein the auto precharge means comprises:

an auto precharge setting unit for achieving auto precharge in a read or write command signal mode in response to the test mode enable signal and one of the plurality of internal address signals; and an auto precharge signal generating unit for generating the plurality of auto precharge signals in response to a reversed signal of an output signal provided from the auto precharge setting unit, the auto precharge control signal, the plurality of buffered bank address signals, and one of the internal command signals of the semiconductor memory device.

12. The circuit of claim 11, wherein the auto precharge setting unit is NOR gate.

13. The circuit of claim 7, wherein the precharge means comprises:

a bank precharge determining unit for determining whether a bank is precharged or not in response to the test mode enable signal and one of the plurality of internal address signals;

a bank precharge signal generating unit for generating the plurality of bank precharge signals in response to a reversed signal of an output signal provided from the bank precharge determining unit, the plurality of buffered bank address signals, the plurality of auto precharge signals, and one of the internal command signals of the semiconductor memory device; and a bank precharge signal summation unit for generating the bank precharge summation signal in response to the plurality of bank precharge signals.

14. The circuit of claim 13, wherein the bank precharge determining unit is NOR gate.

15. The circuit of claim 13, wherein the bank precharge signal summation unit is NAND gate.

16. The circuit of claim 7, wherein the internal clock generating means comprises:

an internal clock generator for generating the first and second internal clock signals when the test mode enable signal is enabled; and a control signal generating unit for receiving the test mode enable signal, the bank precharge summation signal, and one of the internal command signals of the semiconductor memory device and then generating the plurality of internal command control signals synchronously responsive to the first and second internal clock signals.

17. The circuit of claim 16, wherein the control signal generating unit comprises:

a first control signal generating unit for receiving the test mode enable signal and the bank precharge summation signal and then generating a row active control signal synchronously responsive to the first and second internal clock signals;

a second control signal generating unit for receiving the test mode enable signal and one of the internal command signals of the semiconductor device and then generating a column active control signal synchronously responsive to the first and second internal clock signals; and a third control signal generating unit for receiving the test mode enable signal and then generating a precharge control signal synchronously responsive to the first and second internal clock signals.

18. A method for generating internal command signals in a semiconductor memory device, the method comprising:

generating a plurality of internal control signals, a plurality of internal address signals, and a plurality of buffered bank address signals in response to external clock signal of a test equipment, a plurality of external control signals, a plurality of address signals, and a plurality of bank address signals;

composing the plurality of internal control signals and then generating a test mode enable signal and a reversed test mode enable signal, in response to a flag signal for precharging all the bank of the plurality of internal address signals;

generating first and second internal clock signals when the test mode enable signal is enabled;

composing the reversed test mode enable signal and the plurality of internal control signals and then generating internal command signals of the semiconductor memory device;

composing the test mode enable signal, one of the plurality of internal address signals, the plurality of buffered bank address signals, auto precharge control signal, and one of the internal command signals of the semiconductor memory device and then generating a plurality of auto precharge signals;

composing the test mode enable signal, one of the plurality of internal address signals, the plurality of buffered bank address signals, the plurality of auto precharge signals, and one of the internal command signals of the semiconductor memory device and then generating a plurality of bank precharge signals and bank precharge summation signal; and composing the test mode enable signal, the bank precharge summation signal, and one of the internal command signals of the semiconductor memory device and then generating a plurality of internal command control signals which synchronously respond to the first and second internal clock signals.

19. The method of claim 18, wherein generating the first and second internal clock signals comprises generating a third internal clock signal where the cycle time is shorter than that of the external clock signal of the test equipment, and generating the first and second internal clock signals in synchronously response to the third internal clock signal.

20. The method of claim 18, wherein generating the internal command signals of the semiconductor memory device is achieved by composing the reversed test mode enable signal and the plurality of internal control signals in response to the plurality of internal command control signals.

* * * * *